US005654219A

United States Patent [19]
Huber

[11] Patent Number: 5,654,219
[45] Date of Patent: Aug. 5, 1997

[54] ANNEALED POLY-SILICIDE ETCH PROCESS

[75] Inventor: Michael L. Huber, Levelland, Tex.

[73] Assignee: Texas Instruments Incorporated, Dallas, Tex.

[21] Appl. No.: 605,310

[22] Filed: Feb. 7, 1996

[51] Int. Cl.⁶ .................... H01L 21/283; H01L 21/3205
[52] U.S. Cl. .................... 438/592; 438/593; 438/655
[58] Field of Search .................... 437/40 GS, 41 GS, 437/43, 45, 52, 192, 193, 200, 48; 257/377, 413

[56] References Cited

U.S. PATENT DOCUMENTS

| | | | |
|---|---|---|---|
| 4,504,521 | 3/1985 | Widmer et al. | 437/200 |
| 4,608,118 | 8/1986 | Curtis et al. | 156/643 |
| 4,816,425 | 3/1989 | McPherson | 437/200 |
| 4,992,391 | 2/1991 | Wang | 437/43 |
| 5,422,311 | 6/1995 | Woo | 437/193 |

FOREIGN PATENT DOCUMENTS

| | | | |
|---|---|---|---|
| 1-233738 | 9/1989 | Japan | 437/200 |
| 4-73972 | 3/1992 | Japan | 437/200 |

OTHER PUBLICATIONS

Wolf, et al., Silicon Processing, vol. 1, 1986, Lattice Press, pp. 384–392.

*Primary Examiner*—T. N. Quach
*Attorney, Agent, or Firm*—Theodore D. Lindgren; Leo N. Heiting; Richard L. Donaldson

[57] ABSTRACT

A method for forming poly-silicide conductors (CG,GAP) on a semiconductor device (10) includes forming a layer (14) of doped polysilicon over a region of the device (10), then depositing a layer (15) of refractory metal on the layer (14) of doped polysilicon. The layer (14) of doped polysilicon and the layer (15) of refractory metal are then annealed to form a poly-silicide layer (PSL). The poly-silicide layer (PSL) is then etched to form the poly-silicide conductors (CG,GAP).

4 Claims, 2 Drawing Sheets

ANNEALED POLY-SILICIDE ETCH PROCESS

BACKGROUND OF THE INVENTION

This invention relates in general to the field of integrated circuits and, more particularly, to a method of forming poly-silicide conductors for use in such integrated circuits.

Continuous improvement in photolithographic processing capabilities allows use of smaller minimum dimensions for forming the elements of integrated circuits. The smaller dimensions tend to increase the resistances of conductors and of contacts to the conductors. One commonly used way to compensate for the smaller dimensions and the higher resistances is to use refractory metal silicide technology to form low-resistance conductors and low-resistance contacts to the conductor. Silicides include, for example, tungsten disilicide ($WSi_2$) and titanium disilicide ($TiSi_2$). In addition to tungsten and titanium, disilicides are formed from refractory metals such as cobalt, tantalum, molybdenum, platinum and combinations of all such metals. Processes used in forming silicided conductors are described, for example, in U.S. Pat. Nos. 5,173,450; 5,043,300; 4,931,411; 4,894,693; 4,814,854; 4,811,078; 4,811,076; 4,784,973; 4,690,730; 4,686,000; 4,619,038; 4,609,568; 4,561,907; and 4,460,435. Interestingly, U.S. Pat. No. 4,460,435, at column 3, lines 25-30 states that siliciding after etch is the preferred method. Processes are also described, for example, in the following publications: Shih-Chang Chen, et al., "Formation of Titanium Nitride/Titanium Silicide by High Pressure Nitridation in Titanium/Silicon", Japanese Journal of Applied Physics, vol. 30, No. 11A Nov. 1991, pp. 2673-2678; and Tohru Hara, et al., "Formation of Titanium Nitride Layers By the Nitridation of Titanium In High-pressure Ammonium Ambient", Applied Physics Letters, vol. 57, No. 16, Oct. 1990, pp. 1660-1662.

In known prior-art construction processes for integrated circuits, a doped polysilicon layer is formed followed by deposit of a refractory metal layer. The doped polysilicon layer and the refractory metal layer are then etched to form conductors. After the etching step, the doped polysilicon layer and the refractory metal layer are subjected to an annealing process step to form poly-silicide conductors. The prior-art process sequence allows siliciding both the conductors and the source/drain areas simultaneously.

However, certain types of integrated circuits do not require siliciding of the source/drain areas. One such type of integrated circuit is an EPROM (Electrically-Programmable, Read-Only Memory). In the memory-array part of an EPROM, the silicided polysilicon conductor forms the control gates of the memory transistor cells and the wordlines connecting those control gates to the wordline decoder. U.S. Pat. No. 4,281,397 issued Jul. 8, 1981 to Neal et al. entitled "Virtual-Ground MOS EPROM or ROM Matrix" is one example of that type of EPROM, although that patent does not describe siliciding steps, which are described in the previously-cited references.

One of the problems with use of the prior-art sequence is that EPROMs made by etching wordlines/control gates prior to anneal have memory transistor cells with a wide lot-to-lot distribution of threshold voltages Vt. While the reason for the wide distribution is not entirely understood, it is known that polysilicon conductors that are etched prior to annealing with tungsten silicide have notched, or ragged, edges. Past efforts to alter the tungsten siliciding process to minimize notching and/or tungsten crystal formation have not been successful. It is probable that the wide distribution of threshold voltages Vt results from blocked source/drain implants caused by notches and/or tungsten crystal formation on the control-gate conductors that mask such implants. A narrow range of threshold voltages is desirable because, for example, the narrow range minimizes the number of errors in data read from EPROM memory transistor cells.

There is a need for a refractory metal-silicide process that is able to produce transistors with a narrow lot-to-lot range of threshold voltages.

SUMMARY OF THE INVENTION

In accordance with the present invention, a refractory metal silicide deposition process is provided to narrow the lot-to-lot range of threshold voltages of transistors, such as EPROM memory cell transistors.

This invention includes a process sequence for forming silicided conductors, such as transistor gate conductors. The method for forming a poly-silicide conductors on a semiconductor device includes forming a layer of doped polysilicon over a region of the device, then depositing a layer of refractory metal on the layer of doped polysilicon. The layer of doped polysilicon and the layer of refractory metal are then annealed to form a poly-silicide layer. The poly-silicide layer is then etched to form the poly-silicide conductor.

A technical advantage of the disclosed process is that the threshold voltages of the resulting transistors have a narrow range of threshold voltages. The conductors/transistor gates do not have notched/ragged edges, as in prior-art construction processes.

DETAILED DESCRIPTION OF THE INVENTION

The preferred embodiment of the present invention and its advantages are best understood by referring to FIGS. 1A through 1E of the drawings, like numerals being used for corresponding parts of the various drawings. However, it is appreciated that the present invention provides widely applicable inventive concepts, which can be embodied in a variety of specific contexts. The specific embodiment illustrates a specific way to make and use the invention without limiting the scope of the invention.

Figure 1A:
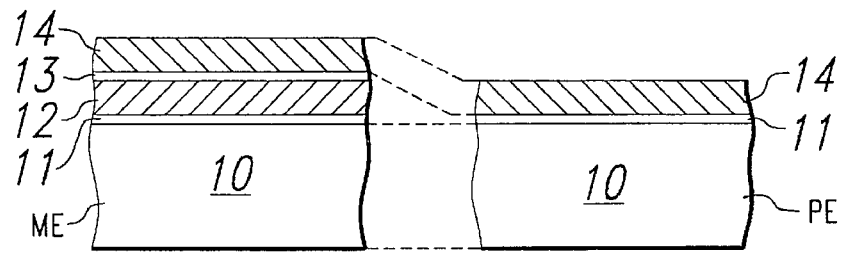
FIGS. 1A through 1E depict highly magnified sequential cross-sectional views of the process of forming an EPROM integrated circuit in accordance with the disclosed invention.

FIG. 1A depicts two highly magnified cross-sections of small parts of an integrated circuit substrate 10. It is noted that this discussion does not include well-known steps relating to formation of field oxide insulating regions using local-oxidation-of-silicon (LOCOS) process, as well as other similarly well-known steps. Cross-section ME is a part of the integrated circuit in which floating-gate memory cell transistors MCT are to be constructed. Cross-section PE is a part of the integrated circuit in which peripheral transistors PET, such as decoding transistors, are to be constructed. Substrate 10 may be a silicon substrate with a concentration of boron to produce a P-type material. Alternatively, substrate 10 may be an epitaxial layer grown on a silicon surface. In addition, the memory part ME of substrate 10 may have been subjected to a separate boron implant step to adjust the average voltage threshold Vt of the memory cells MCT. A gate insulating layer 11 is formed over substrate 10. In the region corresponding to cross-section ME where memory cells MCT are to be formed, a doped first polysilicon layer 12 (poly 1) is formed over gate insulating layer 11. An oxide-nitride-oxide inter-level insulator layer 13 is formed over doped first polysilicon layer 12. Inter-level insulator layer 13 and first polysilicon layer 12 are etched to form floating gate strips, the side views of which are illustrated in cross-sections ME of FIGS. 1A–1C. Next, a second layer 14 (poly 2) of undoped polysilicon about 3000 Angstroms thick is deposited over substrate 10, including both the region corresponding to cross-section ME and the region corresponding to cross-section PE. The second polysilicon layer 14 is then doped in a furnace using a Phosphorus-Oxygen-Chlorine (POCl) gas as the dopant for a target range of 75 to 165 ohms/square of resistance. Oxide grown on polysilicon layer 14 during the deposition is then removed with HF (deglaze).

Figure 1B:
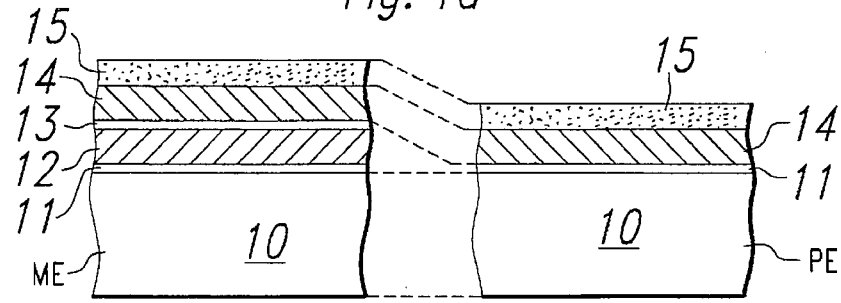

Referring now to FIG. 1B, a refractory metal layer 15 is deposited over second polysilicon layer 14. The class of materials known as refractory metals include titanium, tungsten, cobalt, tantalum, molybdenum and platinum and combinations thereof. Such refractory metals, in disilicide form, have been proven to pair very well with heavily doped polysilicon to form poly-silicided gate conductors, because of the criteria of low resistivity and high temperature stability. In the preferred embodiment, tungsten is used because tungsten silicide has particularly been found to be capable of overcoming some shortcomings, such as self-passivation, good stability in wet chemical ambients, adhesion, and reproducibility in combination with polysilicon in production. The refractory metal layer 15 is, for example, deposited in two steps. The exemplary first step is deposition of a tungsten silicide layer about 1500 Angstroms thick using a tungsten to silicon ratio of about 1 to 2.4. The exemplary second step is deposition of second tungsten silicide layer about 1000 Angstroms thick using a tungsten to silicon ratio of about 1 to 2.6.

Figure 1C:
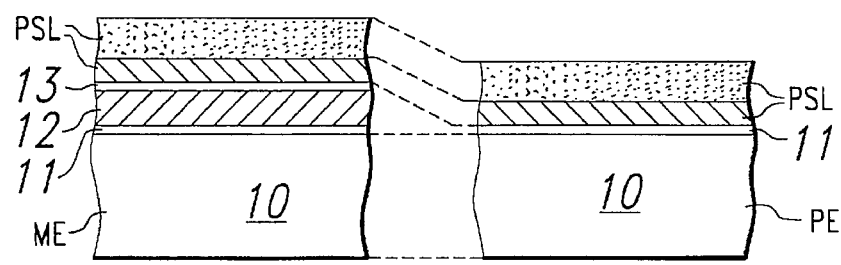

In reference to FIG. 1C, the silicon substrate 10 including layers 14 and 15 is then subjected to an annealing step. The tungsten silicide layer 15 is annealed in a furnace in a nitrogen ambient (18 liters per minute) at a temperature of about 900° C. for about 10 minutes. As illustrated, the annealing step causes silicide layer 15 to merge into a part of layer 14.

Figure 1D:
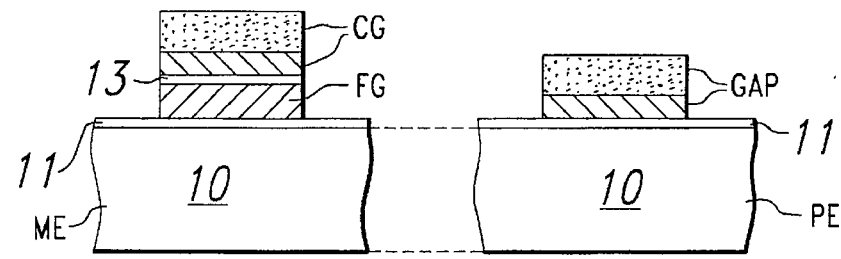

Referring now to FIG. 1D, a layer of photoresist (not shown) is formed over silicide layer 15. At this point, either the control gates/wordlines CG and the floating gates FG of the memory cell (double-level poly) transistors MCT or the gates GAP of the peripheral (single-level poly) transistors PET are patterned and etched. If the control gates/wordlines CG and the floating gates FG of the memory cell (double-level poly) transistors MCT are etched first, then the source/drain implants of memory cells MCT are implanted before patterning and etching the gates GAP of the peripheral transistors, one pattern step is saved in the process. In addition, previous attempts to implant unannealed silicide have been found to cause delamination from the poly. Source/drain region SD are formed within substrate 10 by implanting arsenic, phosphorus, or a combination of the two to produce the regions SD.

Figure 1E:
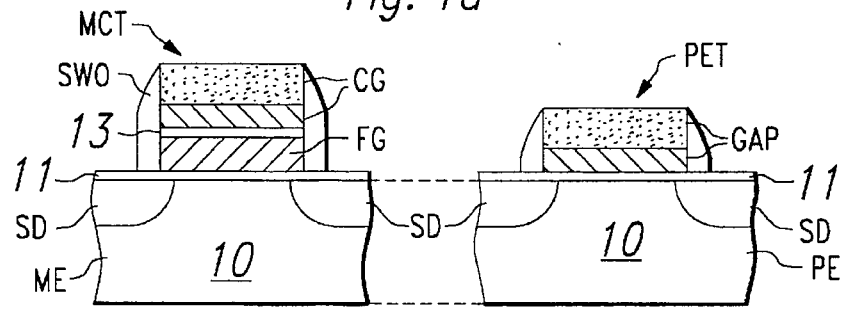

Upon completion of the etch of either the control gates/wordlines CG and the floating gates FG of the memory cell (double-level poly) transistors MCT or the gates GAP of the peripheral (single-level poly) transistors PET and any implant step and after subjecting the structure to a standard asher cleanup process, the pattern and etch step of the remaining transistors is accomplished, followed by a second standard asher cleanup process. Referring to FIG. 1E, sidewall oxide regions SWO are formed on the gates and source/drain regions SD are implanted using procedures well-known in the prior-art. Formation of the sidewall oxide regions SWO may be preceded by a formation of a highly phosphorous doped layer (not shown in FIG. 1E) of oxide on the walls of the gates CG, FG and GAP.

The etching procedures used for the stack etch of the control gates/wordline CG and the floating gates FG and for the gates GAP of the peripheral (single-level poly) transistors PET are identical to procedures well-known in the prior-art with one exception. Because any oxide formed on the silicide layer 15 during the anneal process may impede prior-art etch process, an initial etching step is added to remove any oxide that may have formed during that anneal process. In each of the etching procedures, the added etching step comprises, for example subjecting the wafer to helium at about 105 SCCM and $C_2F_6$ at about 95 SCCM, both at about 600 Tor and about 200 watts of radio-frequency power for about one minute.

Referring again to FIG. 1E, a minimum of 300 Angstroms of TEOS oxide is deposited on the wafer to ensure that there is no delamination of the silicide during the subsequent furnace/oxidation process.

Another layer (not shown) of insulation oxide (multi-level) is deposited. Holes, not shown, are etched for electrical connections, a metal layer (not shown) is deposited, patterned and etched to electrically connect parts of the integrated circuit. The entire structure is covered with an insulating material (not shown). Subsequently the substrate wafer is divided into separate integrated circuits that are packaged for shipment to users.

The Prior-Art Process Flow and alternate Process Flows A, B and C of this invention are summarized in TABLE I below:

TABLE I

| Prior-Art Process Flow | Process Flow A | Process Flow B | Process Flow C |
|---|---|---|---|
| Poly 2 Deposition | Poly 2 Deposition | Poly 2 Deposition | Poly 2 Deposition |
| Phos. Deposition | Phos. Deposition | Phos. Deposition | Phos. Deposition |
| $WSi_2$ Deposition | $WSi_2$ Deposition | $WSi_2$ Deposition | $WSi_2$ Deposition |
| Poly 2 Pattern | $WSi_2$ Anneal | $WSi_2$ Anneal | $WSi_2$ Anneal |
| Poly 2 Etch | Poly 2 Pattern | Stack Pattern | Stack Pattern |
| Stack Pattern | Poly 2 Etch | Stack Etch | Stack Etch |
| Stack Etch | Stack Pattern | Poly 2 Pattern | Stack S/D Implant |
| $WSi_2$ | Stack Etch | Poly 2 Etch | Poly 2 Pattern |

TABLE I-continued

| Prior-Art Process Flow | Process Flow A | Process Flow B | Process Flow C |
|---|---|---|---|
| Anneal/Ox | TEOS Cap ReOx | TEOS Cap ReOx | Poly 2 Etch TEOS Cap ReOx |

Test structures of eighty chips each demonstrate the improvement in voltage threshold distribution through use of Process Flow A of this invention. Using a well-known graphical procedure that derives the standard Gaussian deviation σ from the slope at the edge of the bell-shaped distribution curve, the first test structure resulted in a standard deviation σ of 0.19 for the threshold voltages Vt of memory cells formed using the process of this invention compared to a standard deviation σ of 0.30 for the threshold voltages Vt of memory cells formed using the prior-art process of anneal after etch. In the first test, the center threshold voltages were very different, indicating need for doping of the substrate to change the threshold voltage. Three subsequent test structures were constructed and tested. The results of the tests on these three structures are shown in TABLE II below:

TABLE II

|  | Vt σ for anneal after etch | Vt σ for anneal before etch |
|---|---|---|
| Structure A | 0.275 | 0.210 |
| Structure B | 0.275 | 0.207 |
| Structure C | 0.220 | 0.213 |
| Combined Results | 0.235 | 0.210 |

The results of TABLE II indicate not only an improvement in the standard deviation σ, but an improvement in lot-to-lot variation of the standard deviation σ. Therefore, improved process results in fewer read errors when downloading data from a nonvolatile memory formed using the process of this invention. The fewer read errors are believed to result from elimination of erratic process variations that cause notches and crystal formation on gate conductors.

Figure 2A:
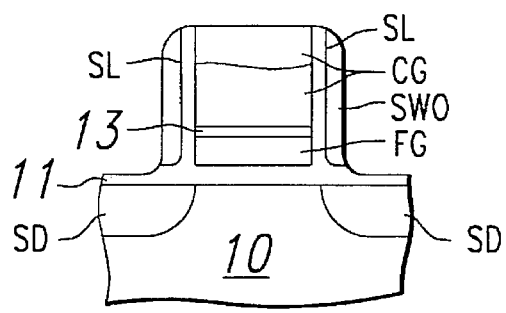
FIG. 2A is a sketch of a cross-sectional microscopic view of an EPROM transistor formed using the anneal-before-etch process of this invention.
Figure 2B:
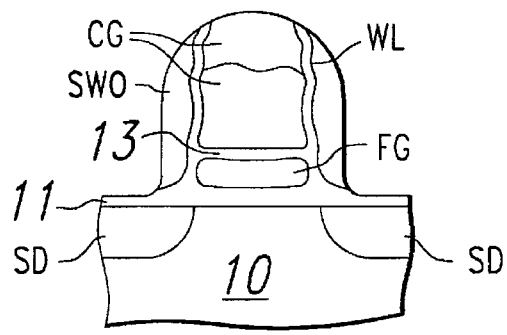
FIG. 2B is a sketch of a cross-sectional microscopic view of an EPROM transistor formed using an etch-before-anneal prior-art process.

Referring now to FIGS. 2A and 2B, FIG. 2A is a sketch of a cross-sectional microscopic view of an EPROM transistor formed using the anneal-before-etch process of this invention. FIG. 2B is a sketch of a cross-sectional microscopic view of an EPROM transistor formed using an etch-before-anneal prior-art process. The anneal-before-etch process of this invention is characterized by the straight-lines SL of FIG. 2A, which are defined by staining a highly phosphorous-doped layer of oxide formed to stop mobile ions from reaching the floating gate FG. Similarly, the etch-before-anneal process of the prior art is characterized by the wavy lines WL of FIG. 2B, which are defined by staining an identically formed highly phosphorous-doped layer of oxide formed to stop mobile ions from reaching the floating gate FG. The devices of FIGS. 2A and 2B were formed on the same wafer.

Figure 3A:
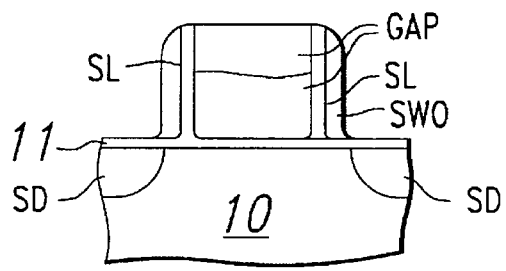
FIG. 3A is a sketch of a cross-sectional microscopic view of a field-effect transistor formed using the anneal-before-etch process of this invention.
Figure 3B:
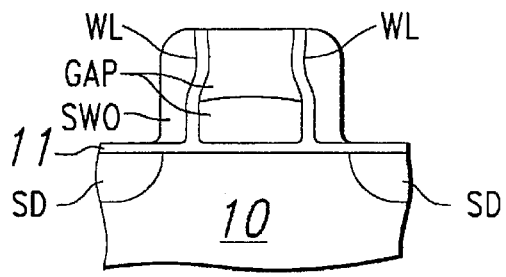
FIG. 3B is a sketch of a cross-sectional microscopic view of a field-effect transistor formed using an etch-before-anneal prior-art process.

Referring now to FIGS. 3A and 3B, FIG. 3A is a sketch of a cross-sectional microscopic view of a field-effect transistor formed using the anneal-before-etch process of this invention. FIG. 3B is a sketch of a cross-sectional microscopic view of a field-effect transistor formed using an etch-before-anneal prior-art process. As in the case of EPROM transistors, the etch-after-anneal process of this invention is characterized by straight-lines SL and the etch-before-anneal process of the prior-art is characterized by wavy lines WL. The devices of FIGS. 3A and 3B were formed on the same wafer.

While the invention has been described with reference to illustrative embodiments, this description is not meant to be construed in a limiting sense. While the invention has been described in terms of an EPROM integrated circuit, the invention is not limited to use with EPROM integrated circuits. Various modifications of the illustrative embodiment, as well as other embodiments of the invention, will be apparent to persons skilled in the art upon reference to this description. It is, therefore, contemplated that the appended claims will cover any such modifications or embodiments that fall within the true scope of the invention.

What is claimed is:

1. A method for narrowing the threshold voltage distribution of a nonvolatile memory cell array, the method comprising:

forming a layer of doped polysilicon over a region of the device;

depositing a layer of refractory metal silicide on the layer of doped polysilicon;

annealing the layer of doped polysilicon and the layer of refractory metal silicide to form a poly-silicide layer; and etching the poly-silicide layer and the doped polysilicon layer to form control gates for the memory cells of said nonvolatile memory array.

2. The method of claim 1, wherein said refractory metal silicide is tungsten silicide.

3. The method of claim 1, wherein the step of depositing said refractory metal silicide layer comprises deposition of a layer about 1000 Angstroms thick with a silicon-tungsten ratio of 2.4 to 1 followed by deposition of a layer about 1500 Angstroms thick with a silicon-tungsten ratio of 2.6 to 1.

4. The method of claim 1, wherein the step of annealing comprises subjecting the device to a temperature of about 900° C. for about 10 minutes in a nitrogen ambient at a flow rate of 18 liters per minute.

* * * * *